United States Patent
Hayashi

(10) Patent No.: US 6,557,767 B1
(45) Date of Patent: May 6, 2003

(54) ANTENNA FRAME FOR IC CARD AND PROCESS FOR MANUFACTURING THE SAME OR IC CARD USING THE SAME

(75) Inventor: Shintaro Hayashi, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/514,272

(22) Filed: Feb. 28, 2000

(30) Foreign Application Priority Data

Mar. 1, 1999 (JP) .......................................... 11-052712

(51) Int. Cl.[7] .............................................. G06K 19/06
(52) U.S. Cl. ........................ 235/492; 343/878; 257/679
(58) Field of Search ................................ 235/492, 382, 235/488, 487, 380; 343/720, 866, 867, 872, 878; 361/737, 728; 257/678, 679

(56) References Cited

U.S. PATENT DOCUMENTS

| | | | |
|---|---|---|---|
| 5,420,757 A | 5/1995 | Eberhardt et al. .......... 361/813 |
| 5,809,633 A | * 9/1998 | Mundigl et al. |
| 5,837,992 A | 11/1998 | Onozawa .................... 235/482 |
| 5,852,289 A | * 12/1998 | Masahiko |
| 5,962,840 A | * 10/1999 | Haghiri-Tehrani et al. |
| 6,018,298 A | * 1/2000 | Endo et al. |

FOREIGN PATENT DOCUMENTS

| | | |
|---|---|---|
| EP | 710 919 A2 | 5/1996 |
| EP | 737 935 A2 | 10/1996 |
| JP | 09-315060 | * 12/1997 |
| JP | 10-138670 | * 5/1998 |
| JP | 10-24564 | * 10/1998 |
| WO | WO 98/04106 | 1/1998 |

* cited by examiner

*Primary Examiner*—Diane I. Lee
(74) *Attorney, Agent, or Firm*—Pennie & Edmonds LLP

(57) ABSTRACT

An antenna frame for IC card includes a plane coil (10) formed by punching or etching a thin metallic sheet in which a conductor (12) is wound by a plurality of times on a substantially same plane. The plane coil (10) has an outermost conductor (12a) provided with an outer end portion (34a) and an innermost conductor (12b) provided with an inner end portion (34b). An outside and inside frames (16, 22) are arranged along the outermost and inner most conductors, respectively, and spaced therefrom by a predetermined interval (20a, 20b). The outer and inner end portions (34a, 34b) define outer and inner terminals (35a, 35b), respectively, which are used as bonding areas. Supporting sections (18, 18a, 18b) extending from an end edge of the outer and inner terminals or a position in the vicinity thereof to the outside and inside frames.

27 Claims, 7 Drawing Sheets

ANTENNA FRAME FOR IC CARD AND PROCESS FOR MANUFACTURING THE SAME OR IC CARD USING THE SAME

BACKGROUND OF THE INVENTION

1. Field of the Invention

The present invention relates to an antenna frame for an IC card and a process for manufacturing the same. More Particularly, the present invention relates to an antenna frame of an IC card having a plane coil formed by punching or etching a thin metallic sheet in which a conductor is wound by a plurality of times on a same plane, wherein terminals of the plane coil and electrode terminals of a semiconductor element are to be electrically connected to each other, and also the present invention relates to a process for manufacturing such an antenna frame for an IC card.

2. Description of the Related Art

As shown in FIG. 9, an IC card includes: a rectangular plane coil 100 in which a conductor 102 is wound by a plurality of times; and a semiconductor element 104. The plane coil 100 and the semiconductor element 104 are interposed between two sheets of resin films 106 made of polyvinyl chloride (PVC) on a front surface of which characters and others are printed. The two sheets of resin films 106 are made to adhere to each other by an adhesive layer made of polyurethane resin. This adhesive layer also seals the plane coil 100 and the semiconductor element 104.

When the thus formed IC card passes in a magnetic field formed by a card processor, an electric power is generated by electromagnetic induction caused in the plane coil 100 of the IC card. Therefore, the semiconductor element 104 is started by the generated electric power, so that communication can be held between the semiconductor element 104 of the IC card and the card processor via the plane coil 100 which functions as an antenna.

In this IC card, the electrical connection between the plane coil 100 and the semiconductor element 104 can be effected by wires 112, 112 which connect the terminals 108, 108 of the plane coil 100 to the electrode terminals 110, 110.

The plane coil 100 in this IC card is formed by punching or etching a thin metallic sheet so as to reduce the cost of production thereof. It has been found that the plane coil 100 thus formed by punching or etching is difficult to handle by itself, since the conductor line 102 may easily be deformed during the transportation.

In order to solve the above mentioned problems, the inventors have tried to use an antenna frame for IC card as shown in FIG. 10 and obtained some improvement in the handling thereof as compared with a case of handling the plane coil by itself.

FIG. 10 shows an antenna frame 200 which is used for IC card and FIG. 11 shows a terminal portion of the antenna frame 200 shown in FIG. 10. The plane coil 216 is provided with respective end portions 218a and 218b of the innermost conductor 226a and the outermost conductor 226b of the plane coil interposing the conductor 226 thereof. These end portions 218a and 218b are formed as wide areas for forming the terminals.

The respective end portions 218a and 218b of the innermost conductor 226a and th outermost conductor 226b is processed by coining to form respective terminals 218a, 218b each provided with a bonding area.

Thus, a bonding operation can easily be performed by using a bonding machine to obtain the electrical connection between the terminals of the semiconductor element which is mounted on the plane coil 216 and the terminals 218a, 218b of the plane coil 216.

However, as shown in FIG. 12, if the coinning operation is applied to the entire surface of the terminals 218, 218, the peripheral area of coined, widen terminal 218 is enlarged toward the conductor 226. In addition, when the coinning operation is performed, the terminals 218, 218 may easily be shifted to the right and left directions (the direction indicated by an arrow B in FIG. 12). Thus, there is a possibility that the terminals 218, 218 comes into contact with the conductor 226.

In particular, such a shift of the terminals 218, 218 would happen, if the bonding area was formed on the respective terminals 218, 218 of the innermost conductor 226a and the outermost conductor 226b.

Also, during the plane coil is transported before the coinning process is applied thereto, such a shift of the terminals 218, 218 may easily happen and the terminals 218, 218 may come into contact with the conductor 226, if the respective terminals 218, 218 of the innermost conductor 226a and the outermost conductor 226b are bent to the inward and outward.

SUMMARY OF THE INVENTION

An object of the present invention is to provide an antenna frame for an IC card and a process for manufacturing such an antenna frame and an IC card using the antenna frame, in which the terminals of the outermost and innermost conductors of the plane coil defining bonding areas are prevented from coming into contact with the conductor constituting the plane coil.

According to the present invention, there is provided an antenna frame for IC card, said antenna frame comprising: a plane coil formed by punching or etching a thin metallic sheet in which a conductor line is wound by a plurality of times on a substantially same plane, said plane coil having an outermost conductor provided with an outer end portion and an innermost conductor provided with an inner end portion; an outside frame arranged along said outermost conductor line and spaced therefrom by a predetermined interval; an inside frame arranged along said innermost conductor line and spaced therefrom by a predetermined interval; said outer and inner end portions defining outer and inner terminals, respectively, which are used as bonding areas; and supporting sections extending from an end edge of said outer and inner terminals or a position in the vicinity thereof to said outside and inside frames.

The bonding area is to be used for electrically connecting by wire-bonding said bonding area to electrode terminals of a semiconductor element which is to be mounted on said plane coil.

The outer and inner terminals of the plane coil is formed by partially or entirely coinning said outer and inner end portions of the outermost and innermost conductors.

The antenna frame, further comprises a chip mounting area formed on said plane coil and defined by a plurality of looped conductors, the width of said conductors within said chip mounting area is smaller than that of remaining portions of said conductors, so that the width of said conductors within said chip mounting area becomes larger to be substantially the same as the width of said remaining portion of said conductors, after said chip mounting area is deformed to be flat.

The chip mounting area is located near to said respective outer and inner end portions of the outermost and innermost conductors.

The outermost and innermost conductor are provided at said end portion or at a position in the vicinity thereof with terminal forming areas, respectively, to which a coinning is to be applied partially or entirely so as to define respective terminals to be used as bonding areas.

The terminal forming areas has a smaller width than remaining portion of said outermost and innermost conductors. The width of said terminal forming areas is determined so that the width thereof becomes larger to be substantially the same as the width of said remaining portion of said outermost and innermost conductors, after said terminal forming area is deformed to be flat.

The antenna frame, further comprises a chip mounting area formed on said plane coil and defined by a plurality of looped conductors, the width of said conductors within said chip mounting area is smaller than that of remaining portions of said conductors, so that the width of said conductors within said chip mounting area becomes larger to be substantially the same as the width of said remaining portion of said conductors, after said chip mounting area is deformed to be flat. The chip mounting area is located near to said respective terminal forming areas.

According to another aspect of the present invention, there is provided a process for manufacturing an antenna frame for IC card, said process comprising the following steps of:

punching or etching a thin metallic sheet to form a plane coil in which a conductor line is wound by a plurality of times on a substantially same plane, said plane coil having outermost and innermost conductors provided with outer and inner end portions, respectively; an outside frame arranged along said outermost conductor line and spaced therefrom by a predetermined interval; an inside frame arranged along said innermost conductor line and spaced therefrom by a predetermined interval; and supporting sections extending from an end edge of said outer and inner end portions or a position in the vicinity thereof to said outside and inside frames; and coinning said end portion or a portion in the vicinity thereof of said outermost and innermost conductors to form outer and inner terminals which are to be used as bonding areas.

The punching or etching step comprises a step for forming said end portion or a portion in the vicinity thereof of said outermost and innermost conductors so as to have a smaller width than remaining portion of said outermost and innermost conductors; and the coinning step comprises a step for enlarging the width of said smaller width portion so as to be substantially the same as the width of said remaining portion of said outermost and innermost conductors.

The punching or etching step further comprises a step for forming a chip mounting area on said plane coil and defined by a plurality of looped conductors, the width of said conductors within said chip mounting area is smaller than that of remaining portions of said conductors; and the coinning step comprises a step for enlarging the width of said conductors within said chip mounting area to by substantially the same as the width of said remaining portion of said conductors.

The chip mounting area is formed at a location near to said respective terminal forming areas.

A process for manufacturing an IC card according to this invention comprises:

punching or etching a thin metallic sheet to form a plane coil in which a conductor line is wound by a plurality of times on a substantially same plane, said plane coil having outermost and innermost conductors provided with outer and inner end portions, respectively; an outside frame arranged along said outermost conductor line and spaced therefrom by a predetermined interval; an inside frame arranged along said innermost conductor line and spaced therefrom by a predetermined interval; and supporting sections extending from an end edge of said outer and inner end portions or a position in the vicinity thereof to said outside and inside frames;

coinning said end portion or a portion in the vicinity thereof of said outermost and innermost conductors to form outer and inner terminals which are to be used as bonding areas;

mounting a semiconductor element on a semiconductor element mounting area of said plane coil; and connecting electrode terminals of said semiconductor element to said bonding areas of said outer and inner terminals by means of wires.

DETAILED DESCRIPTION OF THE EMBODIMENTS

Figure 1:
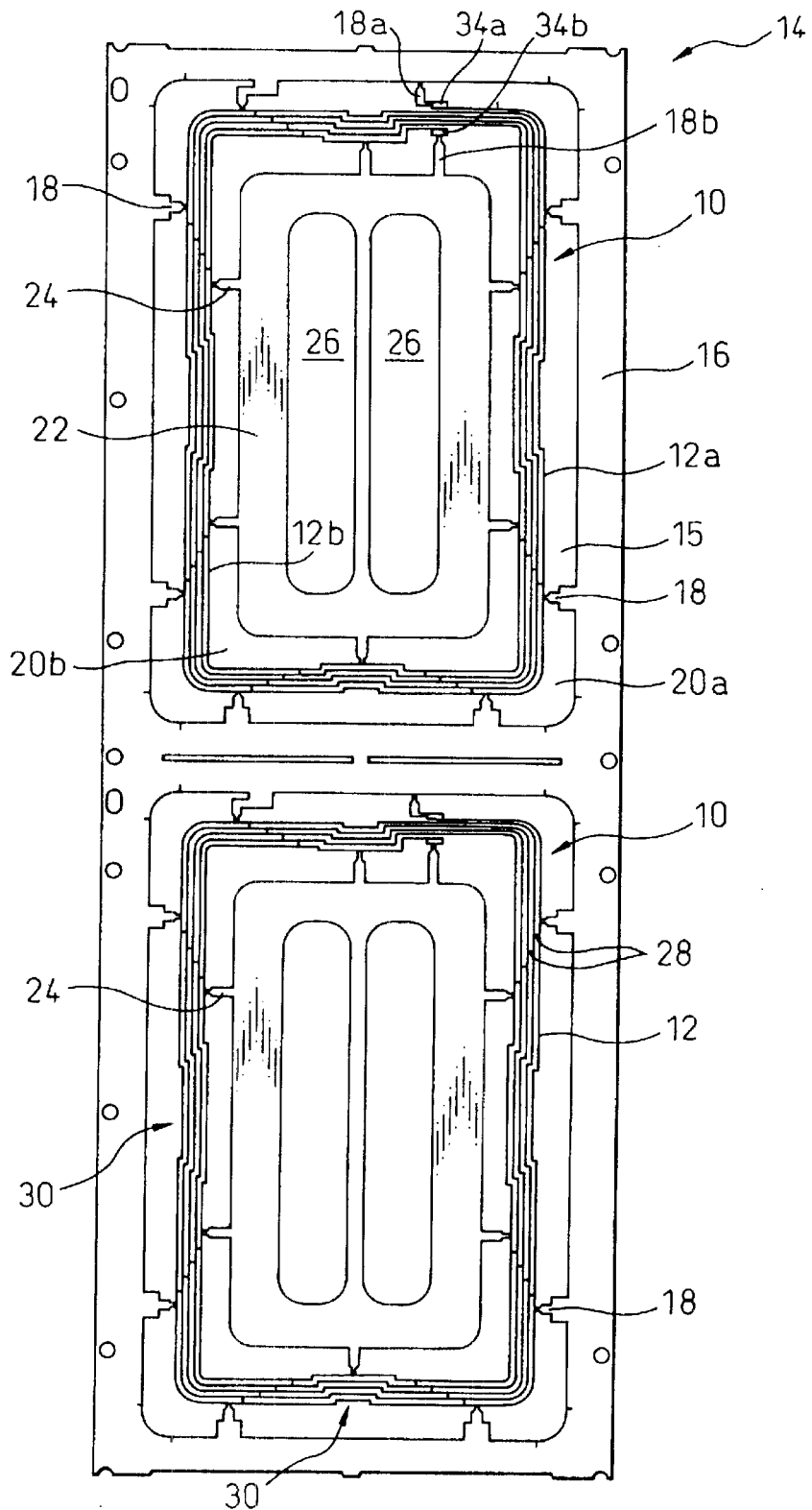
FIG. 1 is a plan view showing an antenna frame for IC card according to the present invention.

Referring now to the drawings, wherein FIG. 1 shows an antenna frame for IC card according to the present invention. The plane coils 10, 10 used in this IC card are formed in the antenna frame 14. The antenna frame 14 is made by punching or etching a thin metallic sheet, preferably a thin metal strip. The plane coil 10, 10 is simultaneously formed with the antenna frame 14.

Concerning the metallic sheet, it is preferable to use a strip-shaped metallic sheet. In this case, a rolled strip-shaped metallic sheet may be used in such a manner that the metallic sheet is drawn out from the rolled strip-shaped metallic sheet.

The antenna frame 14 for the IC card is composed in such a manner that the rectangular plane coil 10, 10 is supported by the outside frame 16 while a predetermined interval 20a is left between the outermost conductor 12a of the plane coil 10, 10 and the outside frame 16. The plane coil 10, 10 is supported in such a manner that end portions of the support portions 18a, 18a . . . extending from the different positions of the inside edge of the outside frame 16 are connected with the outermost conductor 12a of the plane coil 10.

In the inside space of the plane coil 10, there is provided an inside frame 22 which is arranged inside the plane coil 10 while a predetermined interval 20b is left between the innermost conductor 12b of the plane coil 10 and the inside frame 22. The support portions 24, 24 . . . , which extend from a plurality of portions of the inside edge of the inside frame 22 to the plane coil 10, and the innermost conductor 12b of the plane coil 10 are connected with each other. When the inside frame 22 is provided in this way, the inside space of the plane coil 10 can be substantially closed. Due to the above arrangement, it is possible to prevent another IC card from entering the inside space of the plane coil 10 when the antenna frame 14 for the IC card is conveyed.

Therefore, the handling property of the antenna frame 14 for the IC card can be further enhanced. In this inside frame 22, there are provided openings 26, 26 for reducing the weight of the inside frame 22.

Further, the conductors 12, 12, . . . adjacent to each other in the inward and outward direction of the plane coil 10 are connected with each other by connecting pieces 28, 28, . . . , the conductors 12, 12 . . . composing the plane coil 10 can be integrated into one body and prevented from collapsing when the antenna frame 14 for the IC card is conveyed. Therefore, the handling property of the antenna frame of the IC card can be further enhanced. When the connecting pieces 28 are formed stepwise between the conductors 12 arranged on the circumferences as illustrated in FIG. 1, they can be easily cut off by a punch for cutting, and further the mechanical strength of the punch for cutting can be enhanced. These circumstances are described as follows. Usually, the connecting pieces 28, 28 . . . are simultaneously cut off. Therefore, in the case where the connecting pieces 28, 28 . . . are arranged in a straight line, the configuration of the punch for cutting must be formed into a comb-shape, and it is difficult to machine the punch for cutting, and further the mechanical strength of the punch for cutting is decreased. When the connecting pieces 28, 28 . . . are formed stepwise as shown in FIG. 1, it becomes possible to shift the position of the punch for cutting according to the forming position of the connecting pieces 28, 28 . . . Therefore, the punch for cutting can be easily machined, and the mechanical strength of the punch for cutting can be enhanced.

The rectangular plane coil 10 shown in FIG. 1 includes a bent portion 30 which is formed in each linear portion of the plane coil 10. This bent portion 30 is composed of a curved portion in which the conductors 12 on the circumferences are curved and protruded at the substantially same position in the same direction (in the inward direction of the plane coil 10).

Figure 2:
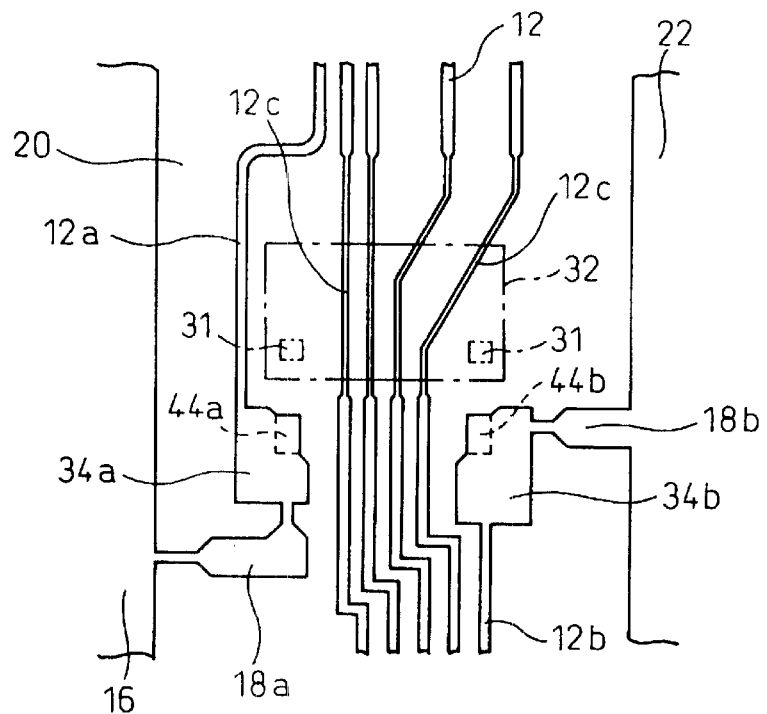
FIG. 2 is a partially enlarged plan view of FIG. 1, showing the antenna frame for IC card.

In FIG. 2, a part of the antenna frame for the IC card, i.e., the end portions of the outermost conductor and innermost conductor are shown in partially enlarged view. In the portion of the plane coil on which the semiconductor element 32 is mounted and the region in the vicinity thereof, the width of the conductor 12c is smaller than that of the conductor 12. This portion of the conductor 12c is the portion to which a coinning operation is applied so as to form a recess for mounting a semiconductor element. The conductor 12c becomes to have substantially the same width as that of the conductor 12 by such a coinning, as shown in FIG. 4.

The end portions 34a, 34b of the outermost conductor 12a and the innermost conductor 12b have the same thickness as those of the outermost conductor 12a and the innermost conductor 12b, but have larger width than those of the outermost conductor 12a and the innermost conductor 12b. One 34a of the end portions 34a and 34b is provided so as to come over the semiconductor element 32 to extend to the position near to the electrode terminal 31, since the terminals 31, 31 are only formed on the one side of the semiconductor element 32.

Figure 4:
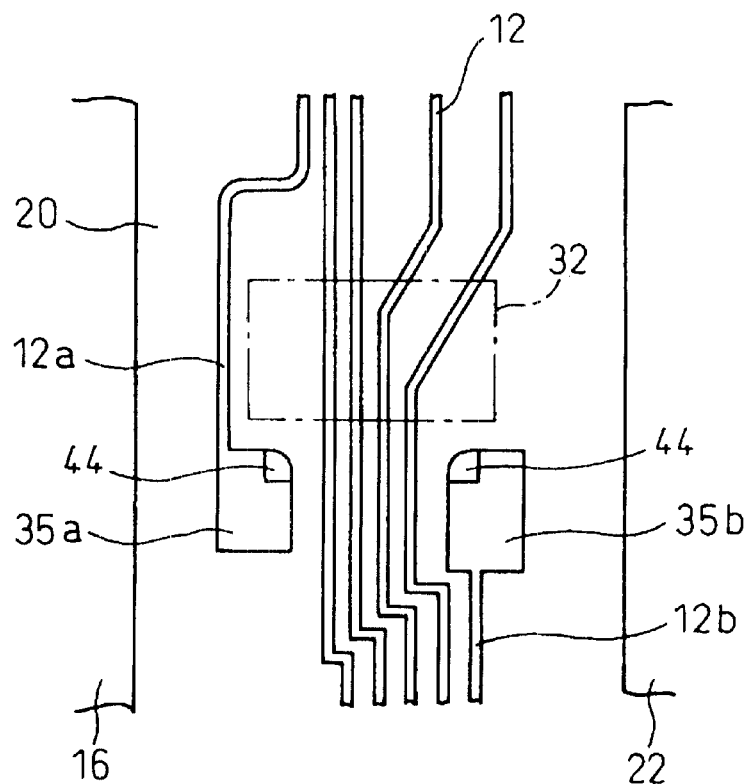
FIG. 4 is a partial plan view showing a part of the antenna frame after that coinning is processed and the supporting sections and the connecting pieces are cut off from the frame.

In FIG. 4, a predetermined part of the antenna frame 14 is shown, in which after coinning is processed and the supporting sections 18 and the connecting pieces 28 are cut off from the antenna frame 14.

The end portion 34a near the outside frame 16 is connected to the outside frame 16 by means of a supporting section 18a which is extending from an edge portion of the end portion 34a and the portion 34b near the inside frame 22 is connected to the inside frame 22 by means of a supporting section 18b which is extending from an edge of the end portion 34b. One 18a of these supporting sections 18a and 18b is extending from an edge of the tip end of the end portion 34a and the other supporting section 18b is extending from an edge of the end portion 34b near the inside frame 22. Thus, the supporting section 18b is extending from the edge of the end portion 34b of the plane coil 10 which is nearest from the inside frame 22.

Figure 3:
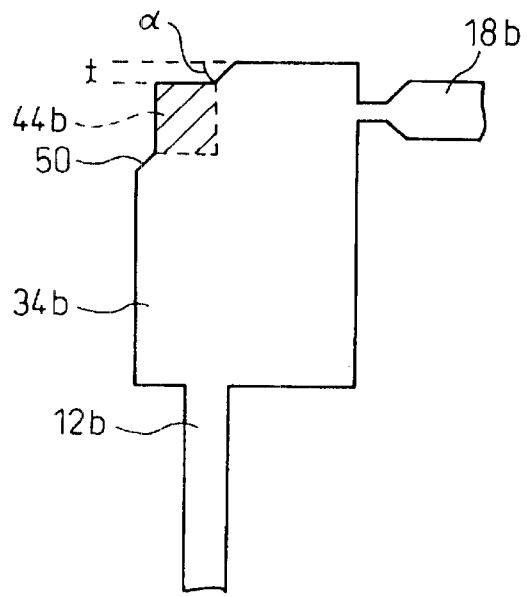
FIG. 3 is a partially enlarged plan view of FIG. 2, showing a part of the antenna frame for IC card.

As shown in FIG. 3, a part of the end portion 34a, 34b is provided with a coinning area 44a, 44b. The coinning area 44a, 44b becomes a bonding area by applying a coinning operation. The edge portion of the coinning area 44a, 44b is retracted from the edge of the end portions 34a, 34b by a distance t. This distance t is determined in such a manner that the coinning area 44a, 44b is deformed and enlarged by the coinning operation to form a bonding area, but the coinning area 44a, 44b is not so enlarged to protrude from the edge of the end portions 35a, 35b.

Each of the end edges 50 of the connecting portions between the coinning areas 44a, 44b and the end portions 34a, 34b is inclined, as shown in FIG. 3, preferably by an angle α of 30° to 45°, so as to prevent a generation of any burrs due to any possible slip of the punching tool when the plane coil is formed by punching process. The end portion 34b has also substantially the same structure as the end portion 34a.

When the coinning operation (cold-forging operation) as mentioned above was performed, since the end portions 34a, 34b were supported by the supporting sections 18a, 18b, the respective the terminals 35a, 35b thus formed were not shifted in the right or the right directions.

Although some strain was found on the outermost conductor 12a connected to the terminal 35a, such a strain was within an allowable range. No such strain was found on the innermost conductor 12b connected to the terminal 35b, which was better than the terminal 35a, although the corner of the terminal 35b extended only a little. In the terminal 35a, the supporting sections 18a was extending from the front end edge of the end portion 34a. Therefore, it seems that, when a coinning operation was performed, any deformation of the end portion 34a in the forward direction was restricted by the supporting sections 18a and, thus, some strain occurred on the outermost conductor 12a.

On the other hand, in the terminal 35b, the supporting sections 18b was extending from the side edge of the end portion 34b. Therefore, any deformation due to coinning could cause in the forward direction of the end portion 34b and, thus, any influence to the innermost conductor 12a could be diminished.

Therefore, it would be preferable that the supporting sections 18a, 18b extending from the side edge of the respective end portions 34a, 34b.

After the coinning operation was applied as mentioned above, the bonding areas of the respective terminals 35a, 35b were plated with a metal, such as, silver or the other, and then the supporting sections 18a, 18b were cut off.

Then, the semiconductor element 32 was mounted on the portion of the conductors 12c, 12c, . . . , where the coinning operation was already performed and, thus, the width of the respective coil portion 12c was widen to substantially the same width of the remaining conductor portion 12. Then, the respective electrode terminals of the semiconductor element 32 were electrically connected to the respective bonding areas 44 of the terminals 35a, 35b of the plane coil 10 by means of bonding wires using a bonding machine. In that case, the terminals 35a, 35b did not shift to the right or left directions and, thus, the positions of these terminals 35a, 35b could be easily and accurately detected by a detecting means of the bonding machine.

Figure 5:
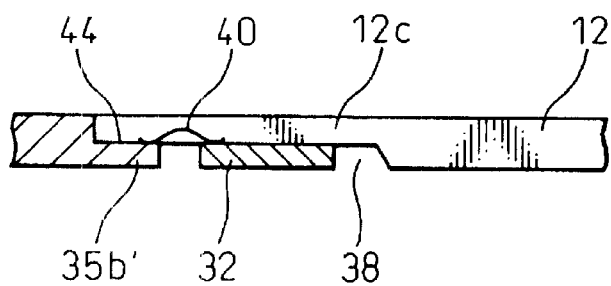
FIG. 5 is a partial plan view showing a semiconductor element mounted on the antenna frame for IC card according to the present invention.

FIG. 5 shows a state in which the electrode terminal of the semiconductor element 32 was connected to the bonding area 44 of the terminal 35b (35a) by the wire 40. The top of the looped wire 40 could be located within the range between the upper surface of the terminal 35b (35a) and the upper surface of the conductor 12, as seen in FIG. 5. To lower the top of the looped wire 40 in this way, a wedge bonding method could be more preferably used than the other bonding methods.

Next, the plane coil 10 on which the semiconductor element 32 was mounted was cut off from the support portion 18a of the outside frame 16 and the support portion 18b of the inside frame 22, and at the same time, the connecting pieces 28, 28 . . . for connecting the conductors 12 on the circumferences were cut off. After that, the plane coil 10 on which the semiconductor element 32 was mounted was sealed. This sealing is made was follows. The plane coil 10 was interposed between two sheets of resin films made of PVC, on the front side of which characters were printed, on the reverse side of which an adhesive layer made of polyurethane resin or polyolefin resin was provided. Thus, an IC card was obtained.

Figure 6:
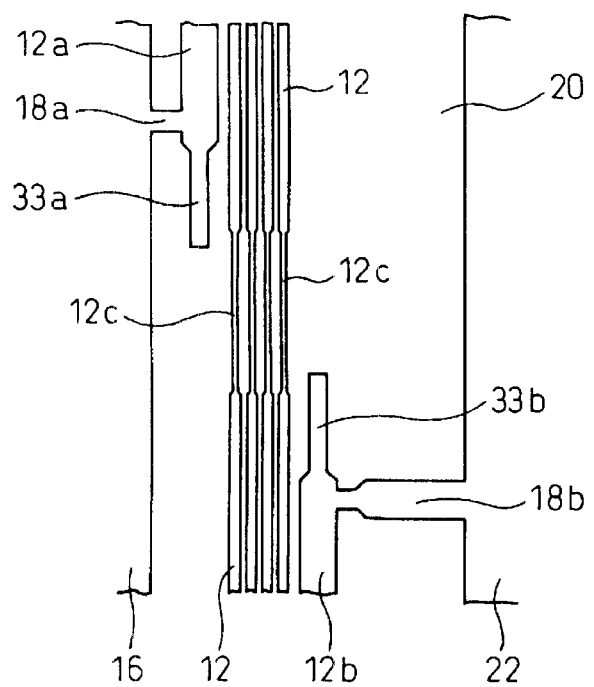
FIG. 6 is a partially enlarged plan view of another embodiment of an antenna frame for IC card according to the present invention.
Figure 7:
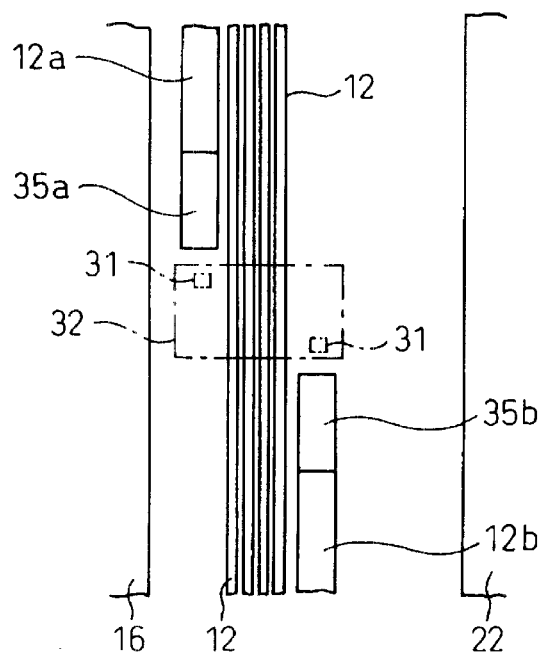
FIG. 7 is a partial plan view showing a part of the antenna frame shown in FIG. 6, after coinning is processed and the supporting sections and the connecting pieces are cut off from the frame.

FIG. 6 shows an antenna frame for IC card, similar to that of FIG. 1, except that the portions near the end portions 33a, 33b of the outermost and innermost conductors 12a, 12b are formed wider than the conductor 12, and the end portions 33a, 33b are formed thinner than the remaining portions of the outermost and innermost conductors 12a, 12b. However, the thickness of the end portions 33a, 33b is substantially the same as the thickness of the remaining portions of the outermost and innermost conductors 12a, 12b. A coinning is applied to the overall area of these end portions 33a, 33b, in such a manner that the end portions 33a, 33b becomes thinner (thickness) and wider to provide terminals 35a, 35b as shown in FIG. 7. Thus, the end portions 33a, 33b are used as the terminal forming areas.

The conductors 12c near the end portions 33a, 33b are formed thinner (narrower) than the conductor 12. A coinning is applied to this area including the conductors 12c and a recess is formed where the semiconductor element 32 is to be mounted as shown in FIG. 7. By such a coinning, the respective conductor 12c becomes to have substantially the same width as that of the conductor 12, as shown in FIG. 7.

The end portions 33a, 33b are located opposite to the respective sides of the semiconductor element 32, since the respective electrode terminals 31, 31 of the semiconductor element 32 are located in the vicinity of the opposite sides thereof. The supporting sections 18a, 18b (FIG. 6) and the connecting pieces 28 (FIG. 1) are cut off in the antenna frame as shown in FIG. 7.

In this embodiment, since the coinning is applied to the overall area of these end portions 33a, 33b, the supporting sections 18a, 18b extend from the side edges in the vicinity of the end portions 33a, 33b. In this embodiment, after the coinning was applied to the end portions 33a, 33b, there was substantially no shift in the right and left directions on thus formed terminals 35a, 35b by coinning.

Figure 8:
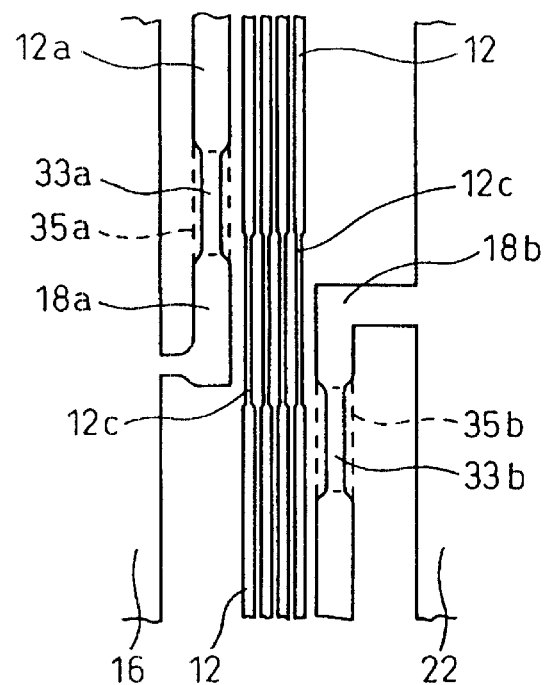
FIG. 8 is a partially enlarged plan view of still another embodiment of an antenna frame for IC card according to the present invention.
Figure 9:
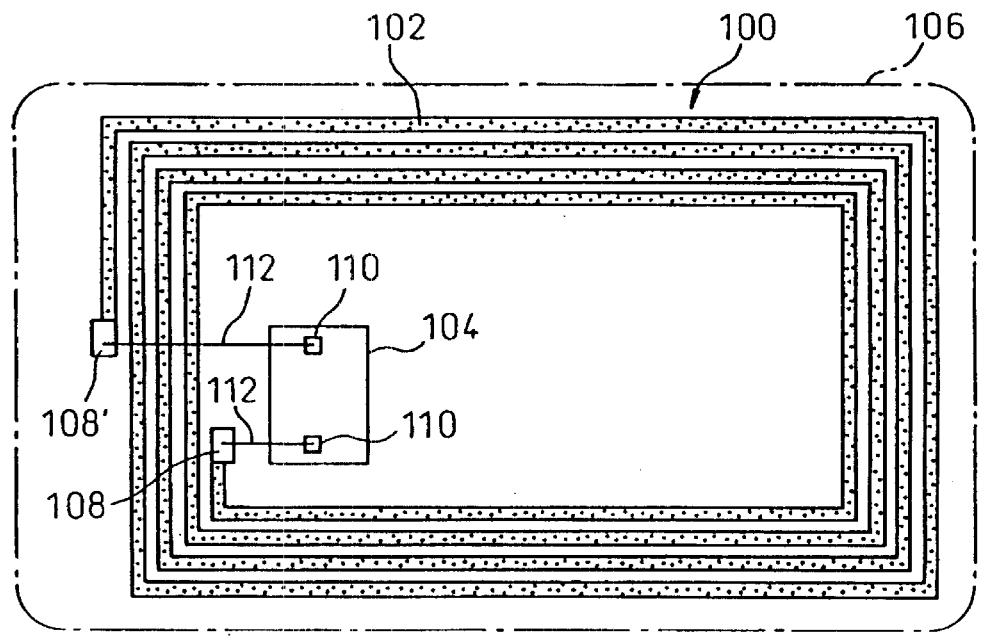
FIG. 9 is a plan view for explaining an IC card.
Figure 10:
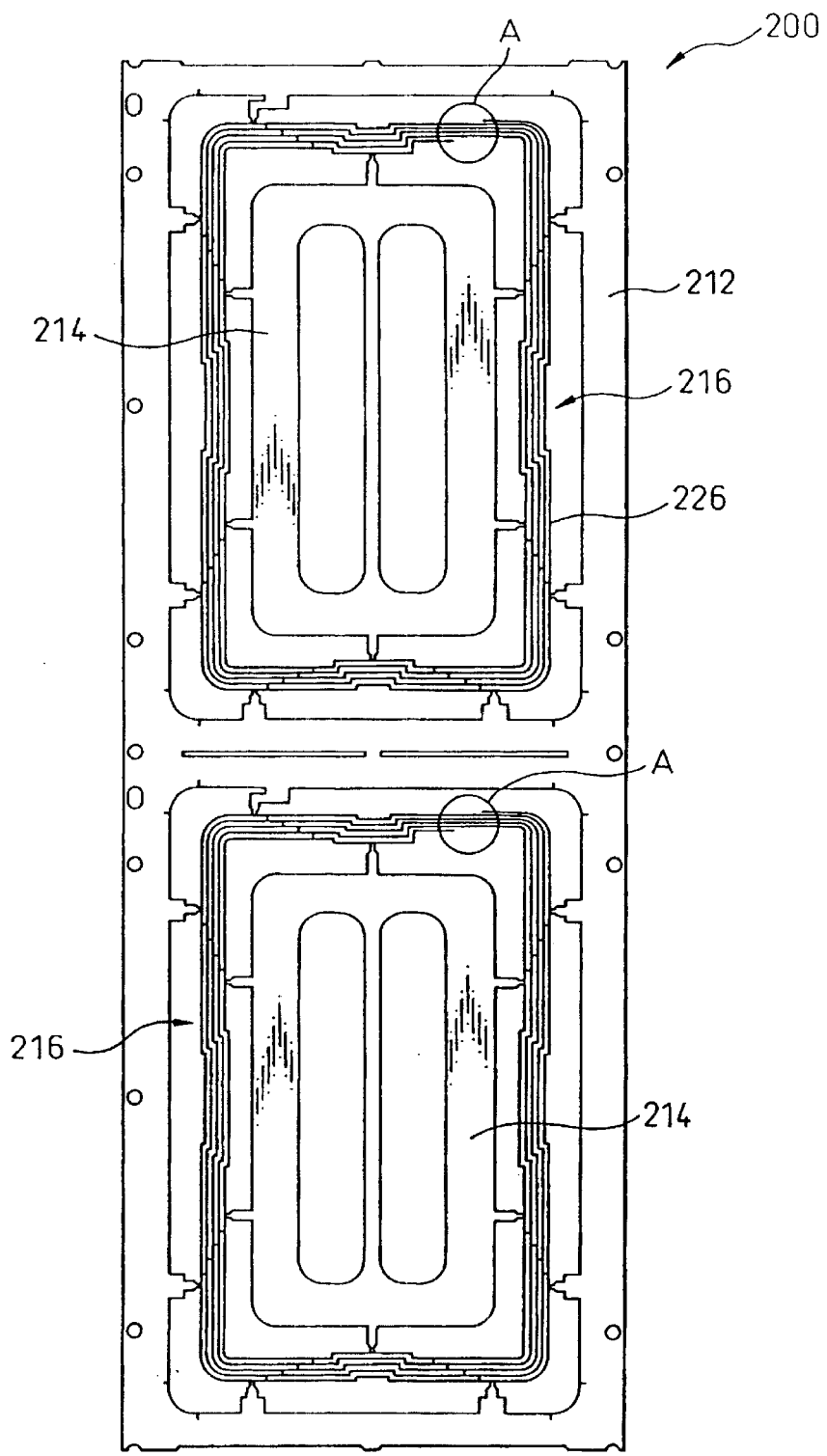
FIG. 10 is a plan view of an antenna frame for IC card for forming a plane coil shown in FIG. 11.
Figure 11:
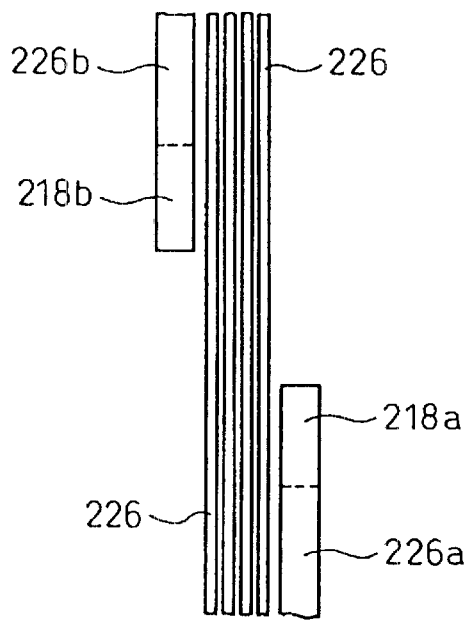
FIG. 11 is a partially enlarged plan view of an antenna frame for IC card shown in FIG. 10.
Figure 12:
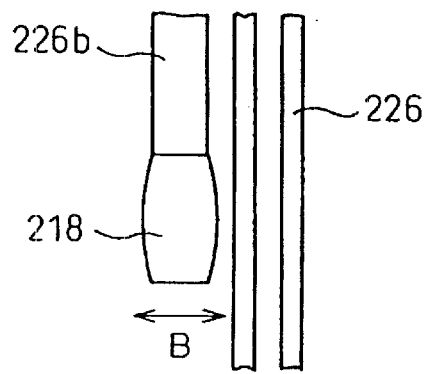
FIG. 12 is a partially enlarged plan view of plane coil shown in FIG. 10, after the terminal portion of the plane coil is processed by coinning.

In FIG. 8, the end portions 33a, 33b (terminal forming areas) of the outermost and innermost conductors 12a, 12b are formed thinner (narrower) than the remaining portions of the outermost and innermost conductors 12a, 12b. The supporting sections 18a, 18b extend from the end edges along the direction of the tip of the end portions 33a, 33b. The width of the supporting sections 18a, 18b is substantially the same as that of the remaining portions of the outermost and innermost conductors 12a, 12b. Since the supporting sections 18a, 18b are formed wider, the terminals 35a, 35b thus formed by coinning will be possible to have sufficient area.

It should be understood by those skilled in the art that the foregoing description relates to only some of the preferred embodiments of the disclosed invention, and that various changes and modifications may be made to the invention without departing from the spirit and scope thereof.

What is claimed is:

1. An antenna frame for IC card, said antenna frame comprising:

a plane coil formed by punching or etching a thin metallic sheet in which a conductor line is wound by a plurality of times on a substantially same plane, said plane coil having an outermost conductor provided with an outer end portion and an innermost conductor provided with an inner end portion;

an outside frame arranged along said outermost conductor line and spaced therefrom by a predetermined interval;

an inside frame arranged along said innermost conductor line and spaced therefrom by a predetermined interval;

said outer and inner end portions defining outer and inner terminals, respectively, which are used as bonding areas; and supporting sections extending from an end edge of said outer and inner terminals or a position in the vicinity thereof to said outside and inside frames;

said antenna frame further comprising a chip mounting area formed on said plane coil and defined by a plurality of looped conductors, the width of said conductors within said chip mounting area being smaller than that of remaining portions of said conductors, so that the width of said conductors within said chip mounting area becomes larger to be substantially the same as the width of said remaining portion of said conductors, after said chip mounting area is deformed to be flat.

2. An antenna frame as set forth in claim 1, wherein said bonding area is to be used for electrically connecting by wire-bonding said bonding area to electrode terminals of a semiconductor element which is to be mounted on said plane coil.

3. An antenna frame as set forth in claim 1, wherein said outer and inner terminals of the plane coil is formed by partially or entirely coining said outer and inner end portions of the outermost and innermost conductors.

4. An antenna frame as set forth in claim 1, wherein said chip mounting area is located near to said respective outer and inner end portions of the outermost and innermost conductors.

5. The antenna frame of claim 1, wherein the supporting sections are formed from the thin metallic sheet and are a continuous piece with the plane coil via the end portions.

6. The antenna frame of claim 5, wherein inside frame and the outside frame are formed from the thin metallic sheet and are a continuous piece with the plane coil via the end portions and supporting sections.

7. The antenna frame of claim 6, wherein the supporting sections extend from a side edge of the end portions, wherein the side edge is the edge adjacent to the edge that is continuous with the plane coil.

8. An antenna frame for IC card, said antenna frame comprising:
   a plane coil formed by punching or etching a thin metallic sheet in which a conductor line is wound by a plurality of times on a substantially same plane, said plane coil having an outermost conductor provided with an outer end portion and an innermost conductor provided with an inner end portion;
   an outside frame arranged along said outermost conductor line and spaced therefrom by a predetermined interval;
   an inside frame arranged along said innermost conductor line and spaced therefrom by a predetermined interval;
   said outermost and innermost conductor provided at said end portion or at a position in the vicinity thereof with terminal forming areas, respectively, wherein said terminal forming areas having a smaller width than the remaining portion of said outermost and innermost conductors, and to which a coining is to be applied partially or entirely so as to define respective terminals to be used as bonding areas;
   supporting sections extending from an end edge of said outer and inner terminals or a position in the vicinity thereof to said outside and inside frames.

9. An antenna frame as set forth in claim 8, wherein said bonding area is to be used for electrically connecting by wire-bonding said bonding area to electrode terminals of a semiconductor element which is to be mounted on said plane coil.

10. An antenna frame as set forth in claim 6, wherein the width of said terminal forming areas is determined so that the width thereof becomes larger to be substantially the same as the width of said remaining portion of said outermost and innermost conductors, after said terminal forming area is deformed to be flat.

11. An antenna frame as set forth in claim 8, further comprising a chip mounting area formed on said plane coil and defined by a plurality of looped conductors, the width of said conductors within said chip mounting area is smaller than that of remaining portions of said conductors, so that the width of said conductors within said chip mounting area becomes larger to be substantially the same as the width of said remaining portion of said conductors, after said chip mounting area is deformed to be flat.

12. An antenna frame as set forth in claim 11, wherein said chip mounting area is located near to said respective terminal forming areas.

13. An antenna frame as set forth in claim 8, wherein said supporting sections extend from an end edge of said outer and inner terminals or a position in the vicinity thereof at positions which is nearest from said outside and inside frames.

14. The antenna frame of claim 8, wherein the supporting sections are formed from the thin metallic sheet and are a continuous piece with the plane coil via the end portions.

15. The antenna frame of claim 14, wherein inside frame and the outside frame are formed from the thin metallic sheet and are a continuous piece with the plane coil via the end portions and supporting sections.

16. The antenna frame of claim 15, wherein the supporting sections extend from a side edge of the end portions, wherein the side edge is the edge adjacent to the edge that is continuous with the plane coil.

17. A process for manufacturing an antenna frame for IC card, said process comprising the following steps of:
   punching or etching a thin metallic sheet to form a plane coil in which a conductor line is wound by a plurality of times on a substantially same plane, said plane coil having outermost and innermost conductors provided with outer and inner end portions, respectively; wherein an outside frame is arranged along said outermost conductor line and spaced therefrom by a predetermined interval and an inside frame is arranged along said innermost conductor line and spaced therefrom by a predetermined interval, and supporting sections extend from an end edge of said outer and inner end portions or a position in the vicinity thereof to said outside and inside frames; and
   coining said end portion or a portion in the vicinity thereof of said outermost and innermost conductors to form outer and inner terminals which are to be used as bonding areas,
   wherein said punching or etching step comprises a step for forming said end portion or a portion in the vicinity thereof of said outermost and innermost conductors so as to have a smaller width than remaining portion of said outermost and innermost conductors, and said coining step comprising a step for enlarging the width of said smaller width portion so as to be substantially the same as the width of said remaining portion of said outermost and innermost conductors.

18. A process as set forth in claim 13, wherein said chip mounting area is formed at a location near to said respective terminal forming areas.

19. The process of claim 17, wherein the supporting sections are formed from the thin metallic sheet and are a continuous piece with the plane coil via the end portions.

20. The process of claim 19, wherein inside frame and the outside frame are formed from the thin metallic sheet and are a continuous piece with the plane coil via the end portions and supporting sections.

21. The process of claim 20, wherein the supporting sections extend from a side edge of the end portions, wherein the side edge is the edge adjacent to the edge that is continuous with the plane coil.

22. A process for manufacturing an IC card, said process comprising:
   punching or etching a thin metallic sheet to form a plane coil in which a conductor line is wound by a plurality of times on a substantially same plane, said plane coil having outermost and innermost conductors provided with outer and inner end portions, respectively, an outside frame arranged along said outermost conductor line and spaced therefrom by a predetermined interval, an inside frame arranged along said innermost conductor line and spaced therefrom by a predetermined interval, and supporting sections extending from an end edge of said outer and inner end portions or a position in the vicinity thereof to said outside and inside frames, said punching or etching step further comprising forming a chip mounting area on said plane coil which is defined by portions of a plurality of looped conductors, the width of said portions of said conductors within said chip mounting area being smaller than that of remaining portions of said conductors;

coining said end portion or a portion in the vicinity thereof of said outermost and innermost conductors to form outer and inner terminals which are to be used as bonding areas, said coining step comprising a step for enlarging the width of said conductors within said chip mounting area to be substantially the same as the width of said remaining portion of said conductors mounting a semiconductor element on a semiconductor element mounting area of said plane coil; and connecting electrode terminals of said semiconductor element to said bonding areas of said outer and inner terminals by means of wires.

23. The process of claim 22, wherein the supporting sections are formed from the thin metallic sheet and are a continuous piece with the plane coil via the end portions.

24. The process of claim 23, wherein inside frame and the outside frame are formed from the thin metallic sheet and are a continuous piece with the plane coil via the end portions and supporting sections.

25. The process of claim 24, wherein the supporting sections extend from a side edge of the end portions, wherein the side edge is the edge adjacent to the edge that is continuous with the plane coil.

26. An antenna frame for IC card, said antenna frame comprising:

a plane coil formed by punching or etching a thin metallic sheet in which a conductor line is wound by a plurality of times on a substantially same plane, said plane coil having an outermost conductor provided with an outer end portion and an innermost conductor provided with an inner end portion;

an outside frame arranged along said outermost conductor line and spaced therefrom by a predetermined interval;

an inside frame arranged along said innermost conductor line and spaced therefrom by a predetermined interval;

said outermost and innermost conductor provided at said end portion or at a position in the vicinity thereof with terminal forming areas, respectively, to which a coining is to be applied partially or entirely so as to define respective terminals to be used as bonding areas;

supporting sections extending from an end edge of said outer and inner terminals or a position in the vicinity thereof to said outside and inside frames;

a chip mounting area formed on said plane coil and defined by a plurality of looped conductors, the width of said conductors within said chip mounting area being smaller than that of remaining portions of the conductors, so that the width of said conductors within said chip mounting area become larger to be substantially the same as the width of said remaining portion of said conductors, after said chip mounting area is deformed to be flat.

27. A process for manufacturing an antenna frame for IC card, said process comprising the following steps of:

punching or etching a thin metallic sheet to form a plane coil in which a conductor line is wound by a plurality of times on a substantially same plane, said plane coil having outermost and innermost conductors provided with outer and inner end portions, respectively;

wherein an outside frame is arranged along said outermost conductor line and spaced therefrom by a predetermined interval and an inside frame is arranged along said innermost conductor line and spaced therefrom by a predetermined interval and supporting sections extend from an end edge of said outer and inner end portions or a position in the vicinity thereof to said outside and inside frames; and coining said end portion or a portion in the vicinity thereof of said outermost and innermost conductors to form outer and inner terminals which are to be used as bonding areas, wherein said punching or etching step further comprises a step for forming a chip mounting area on said plane coil which is defined by a plurality of portions of looped conductors, the width of said portions of said conductors within said chip mounting area being smaller than that of remaining portions of said conductors; and said coining step comprising a step for enlarging the width of said conductors within said chip mounting area to be substantially the same as the width of said remaining portion of said conductors.

* * * * *